(12) United States Patent
Avila et al.

(10) Patent No.: US 8,713,380 B2
(45) Date of Patent: Apr. 29, 2014

(54) NON-VOLATILE MEMORY AND METHOD HAVING EFFICIENT ON-CHIP BLOCK-COPYING WITH CONTROLLED ERROR RATE

(75) Inventors: Chris Nga Yee Avila, Saratoga, CA (US); Jianmin Huang, Sunnyvale, CA (US); Lee M. Gavens, Milpitas, CA (US); Idan Alrod, Herzliya (IL)

(73) Assignee: Sandisk Technologies, Inc., Plano, TX (US)

( * ) Notice: Subject to any disclaimer, the term of this patent is extended or adjusted under 35 U.S.C. 154(b) by 176 days.

(21) Appl. No.: 13/457,247

(22) Filed: Apr. 26, 2012

(65) Prior Publication Data

US 2012/0284574 A1 Nov. 8, 2012

Related U.S. Application Data

(60) Provisional application No. 61/482,104, filed on May 3, 2011.

(51) Int. Cl.
*G06F 11/00* (2006.01)

(52) U.S. Cl.
USPC ..................................... 714/704; 365/185.24

(58) Field of Classification Search
USPC ........... 375/317; 365/185.02, 185.03, 189.09, 365/185.24; 711/103; 714/718, 704
See application file for complete search history.

(56) References Cited

U.S. PATENT DOCUMENTS

| | | | |
|---|---|---|---|
| 5,070,032 A | 12/1991 | Yuan et al. | |
| 5,095,344 A | 3/1992 | Harari | |
| 5,313,421 A | 5/1994 | Guterman et al. | |
| 5,315,541 A | 5/1994 | Harari et al. | |
| 5,343,063 A | 8/1994 | Yuan et al. | |
| 5,570,315 A | 10/1996 | Tanaka et al. | |
| 5,661,053 A | 8/1997 | Yuan | |
| 5,768,192 A | 6/1998 | Eitan | |
| 5,903,495 A | 5/1999 | Takeuchi et al. | |
| 6,011,725 A | 1/2000 | Eitan | |
| 6,046,935 A | 4/2000 | Takeuchi et al. | |
| 6,222,762 B1 | 4/2001 | Guterman et al. | |
| 7,218,686 B2 * | 5/2007 | Matsumoto et al. | 375/317 |
| 7,518,913 B2 * | 4/2009 | Wang et al. | 365/185.03 |

(Continued)

OTHER PUBLICATIONS

Notification of Transmittal of the International Search Report and the Written Opinion of the International Searching Authority, or the Declaration for International Application No. PCT/US2012/035637 mailed Jul. 17, 2012, 12 pages.

(Continued)

*Primary Examiner* — David Ton
(74) *Attorney, Agent, or Firm* — Davis Wright Tremaine LLP

(57) ABSTRACT

A non-volatile memory chip having SLC blocks acting as a write cache for MLC blocks for high density storage requires constant copying or folding of SLC blocks into MLC blocks. To avoid the time-consuming toggling out and in of the pages of the entire SLC block for ECC checking by a controller chip, only a small sample is checked. An optimal read point for reading the memory cells in the sample of the SLC block is dynamically determined by trying different read points so that the data is read within an error budget. Once the optimal read point is determined, it is used to read the entire SLC block without further error checking. Then the SLC block can be copied (blind folded) to the MLC block with the confidence of being within the error budget.

20 Claims, 9 Drawing Sheets

(56) References Cited

U.S. PATENT DOCUMENTS

| | | | |
|---|---|---|---|
| 7,830,708 B1 * | 11/2010 | Jung et al. | 365/185.03 |
| 7,974,139 B2 * | 7/2011 | Kim et al. | 365/189.09 |
| 8,427,867 B2 * | 4/2013 | Weingarten | 365/185.02 |
| 2006/0126383 A1 | 6/2006 | Shappir et al. | |
| 2007/0091677 A1 | 4/2007 | Lasser et al. | |
| 2009/0021978 A1 | 1/2009 | Lin et al. | |
| 2010/0131697 A1 * | 5/2010 | Alrod et al. | 711/103 |
| 2010/0172180 A1 | 7/2010 | Paley et al. | |
| 2011/0099460 A1 | 4/2011 | Dusja et al. | |

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

* cited by examiner

Programming into two states represented by a 1-bit code

IDEAL

PROGRAM DISTURB

DYNAMIC READ POINT

| BLOCK# | TAG | HOT COUNT | STORAGE PERIOD | TRIAL READ POINTS |

← 700 →

NON-VOLATILE MEMORY AND METHOD HAVING EFFICIENT ON-CHIP BLOCK-COPYING WITH CONTROLLED ERROR RATE

CROSS-REFERENCED APPLICATION

This application claims priority to U.S. Provisional Application No. 61/482,104 filed May 3, 2011, which application is incorporated in its entirety by this reference.

FIELD OF THE INVENTION

This application relates to the operation of re-programmable non-volatile memory systems such as semiconductor flash memory, and, more specifically, to efficient copying of data with controlled error rate from a lower density memory portion to a higher density memory portion.

BACKGROUND OF THE INVENTION

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retaining its stored data even after power is turned off. Also, unlike ROM (read only memory), flash memory is rewritable similar to a disk storage device. In spite of the higher cost, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, both embedded and in the form of a removable card are ideally suited in the mobile and handheld environment because of its small size, low power consumption, high speed and high reliability features.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. In particular, flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

It is common in current commercial products for each storage element of a flash EEPROM array to store a single bit of data by operating in a binary mode, where two ranges of threshold levels of the storage element transistors are defined as storage levels. The threshold levels of transistors correspond to ranges of charge levels stored on their storage elements. In addition to shrinking the size of the memory arrays, the trend is to further increase the density of data storage of such memory arrays by storing more than one bit of data in each storage element transistor. This is accomplished by defining more than two threshold levels as storage states for each storage element transistor, four such states (2 bits of data per storage element) now being included in commercial products. More storage states, such as 16 states per storage element, are also being implemented. Each storage element memory transistor has a certain total range (window) of threshold voltages in which it may practically be operated, and that range is divided into the number of states defined for it plus margins between the states to allow for them to be clearly differentiated from one another. Obviously, the more bits a memory cell is configured to store, the smaller is the margin of error it has to operate in.

The transistor serving as a memory cell is typically programmed to a "programmed" state by one of two mechanisms. In "hot electron injection," a high voltage applied to the drain accelerates electrons across the substrate channel region. At the same time a high voltage applied to the control gate pulls the hot electrons through a thin gate dielectric onto the floating gate. In "tunneling injection," a high voltage is applied to the control gate relative to the substrate. In this way, electrons are pulled from the substrate to the intervening floating gate. While the term "program" has been used historically to describe writing to a memory by injecting electrons to an initially erased charge storage unit of the memory cell so as to alter the memory state, it has now been used interchangeable with more common terms such as "write" or "record."

The memory device may be erased by a number of mechanisms. For EEPROM, a memory cell is electrically erasable, by applying a high voltage to the substrate relative to the control gate so as to induce electrons in the floating gate to tunnel through a thin oxide to the substrate channel region (i.e., Fowler-Nordheim tunneling.) Typically, the EEPROM is erasable byte by byte. For flash EEPROM, the memory is electrically erasable either all at once or one or more minimum erasable blocks at a time, where a minimum erasable block may consist of one or more sectors and each sector may store 512 bytes or more of data.

The memory device typically comprises one or more memory chips that may be mounted on a card. Each memory chip comprises an array of memory cells supported by peripheral circuits such as decoders and erase, write and read circuits. The more sophisticated memory devices also come with a controller that performs intelligent and higher level memory operations and interfacing.

There are many commercially successful non-volatile solid-state memory devices being used today. These memory devices may be flash EEPROM or may employ other types of nonvolatile memory cells. Examples of flash memory and systems and methods of manufacturing them are given in U.S. Pat. Nos. 5,070,032, 5,095,344, 5,315,541, 5,343,063, and 5,661,053, 5,313,421 and 6,222,762. In particular, flash memory devices with NAND string structures are described in U.S. Pat. Nos. 5,570,315, 5,903,495, 6,046,935. Also nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

Errors in Written Data

In the types of memory systems described herein, as well as in others, including magnetic disc storage systems, the integrity of the data being stored is maintained by use of an error correction technique. Most commonly, an error correction code (ECC) is calculated for each sector or other unit of data that is being stored at one time, and that ECC is stored along with the data. The ECC is most commonly stored together with a unit group of user data from which the ECC has been calculated. The unit group of user data may be a sector or a multi-sector page. When this data is read from the memory, the ECC is used to determine the integrity of the user data being read. Erroneous bits of data within the unit group of data can often be corrected by use of the ECC.

The trend is to reduce the size of the memory systems in order to be able to put more memory cells in the system and to make the system as small as possible to fit in smaller host devices. Memory capacity is increased by a combination of higher integration of circuits and configuring each memory cell to store more bits of data. Both techniques require the memory to operate with increasing tighter margin of error. This in turn places more demand on the ECC to correct errors. The ECC can be designed to correct a predetermined number of error bits. The more bits it has to correct, the more complex and computationally intensive will the ECC be.

A memory device typically includes one or more memory chips in cooperation with a memory controller chip. Each memory chip has an array of memory cells and peripheral circuits and a basic on-chip control circuit driven by a state machine to control low-level memory operations such as read, write and erase operations. The memory controller chip typically has a microprocessor and RAM to handle more complex operations and data processing. Since ECC is computationally intensive, it is usually handled by the memory controller. Owing to the ECC being located on an external memory controller, data read from the memory chip must be toggled out to the memory controller in order to perform ECC operations.

A non-volatile memory typically operates with a host to store and retrieve data. In a normal host read, the read data has to be toggled out anyway, so on it way to the host via the controller, it can have the controller perform ECC operations.

However, for proper and efficient operations, the non-volatile memory device also needs to perform many internal memory operations such as copying data between different portions of the memory. A particular implementation of a memory has its memory array partitioned into an MLC (multi-level cell) portion and a SLC (single-level cell) portion. The MLC portion is able to store data more densely and the SLC portion is able to store data more robustly. A preferred operational scheme is to have the SLC portion serving as a write cache, where data from the host is first written and later copied from the SLC portion to the MLC portion.

For this type of memory, on-chip copying involves reading the data from the SLC portion and writing the same data to the MLC portion. Such operation is referred to as "folding". For example, in a memory partitioned with a 1-bit SLC (D1) and 3-bit MLC (D3), three D1 blocks are folded into every one D3 block.

However, if the read D1 blocks need to be checked and corrected for any errors, the data in these blocks will have to be toggled out to the controller. After the data is checked for errors and corrected by ECC if required, it has to be transferred back to the memory chip before being folded to the MLC destination block. Such approach has significant performance impact to the system. In addition, such approach also requires controller RAM to keep the data for ECC correction after source data is toggled out.

Consequently, in one approach for enhanced performance, a memory system typically uses a "totally blind folding" method (which refrains from transferring out SLC source data and transferring back in for MLC destination page) to copy the data. As a result, no attempt is made for ECC correction as there is no data transferred out to controller.

However, totally blind folding is not reliable. If SLC source blocks have higher error rate due to wearing out of the memory (such as by program/erase cycles or data retention) and they are not being corrected, then when copied to MLC destination blocks, the MLC blocks will end up with even higher error rate and may not be recoverable even with on-system ECC correction scheme.

Thus, there is a need to provide a nonvolatile memory with efficient on-chip block-copying while controlling error rates.

SUMMARY OF INVENTION

According to one aspect of the invention, an optimal read point for reading the memory cells in a block of the SLC portion is dynamically determined by trying different read points dynamically to read a sample of the data of the block so that the data is read within an error budget. Once the optimal read point is determined, it is used to read the entire block without further error checking.

According to a preferred embodiment, the SLC block of data comprises of a plurality of data pages, each having an ECC associated therewith. The measure of the error rate of the SLC block of data is by checking the ECC of a sample of the data pages of the block, wherein the error bits of any of the data pages in the sample must be within the error budget. At least the sample data pages need be subject to the dynamic read and be shuttled to the controller for ECC checking. If a trial read point results in all the sample data pages to have error rates within the error budget, the trial read point is selected to read the entire SLC block without further need for ECC checking (blind reading). Then the data read from the SLC portion are copied (blind folded) to the MLC portion.

In a preferred embodiment, only the first and last page of the SLC block is selected in the sample. For D1 (1-bit) to D3 (3-bit) folding, three SLC blocks will be folding into one MLC block and therefore a total of six pages from the three SLC blocks will be toggled out to the controller for ECC operations.

In the event that an optimal NAND internal read level cannot be found for a first SLC source block, the data from the first SLC source block will be copied to a second, new SLC source block, preferably with a smaller hot count. Then the dynamic sample read error management can be started on the second SLC block instead.

According to another aspect of the invention, without transferring data from NAND to the controller for ECC checking of the samples, an alternative method is to count the number of bits in the forbidden zone (between erase and program states) and then move the NAND Vt threshold to the point in which the least amount of bits are counted.

According to another aspect of the invention, the dynamic sample read error management on a given block is enabled only when the block's hot count has reached a predetermined threshold.

According to yet another aspect of the invention, a tag is associated with each block to indicate if the dynamic sample read error management should or should not be enabled for the block in question.

In one embodiment, the tag is set for enabling if the hot count of the block has reached a predetermined threshold.

In another embodiment, the tag is set for enabling if the data has been stored in the block past a predetermined period.

In another embodiment, additional tagging mechanisms (e.g., table maintained in flash memory) are provided to match different dynamic read cases (e.g., the amount of ΔV) per tag and to use them when needed without the need to look on each read. Such tagging mechanisms can be time based rather than based on hot count. Furthermore, how often the tagging table shall be updated can be fine-tuned, based on targeted product's performance requirements.

Additional features and advantages of the present invention will be understood from the following description of its preferred embodiments, which description should be taken in conjunction with the accompanying drawings.

DETAILED DESCRIPTION OF THE PREFERRED EMBODIMENTS

Memory System

Figure 1:
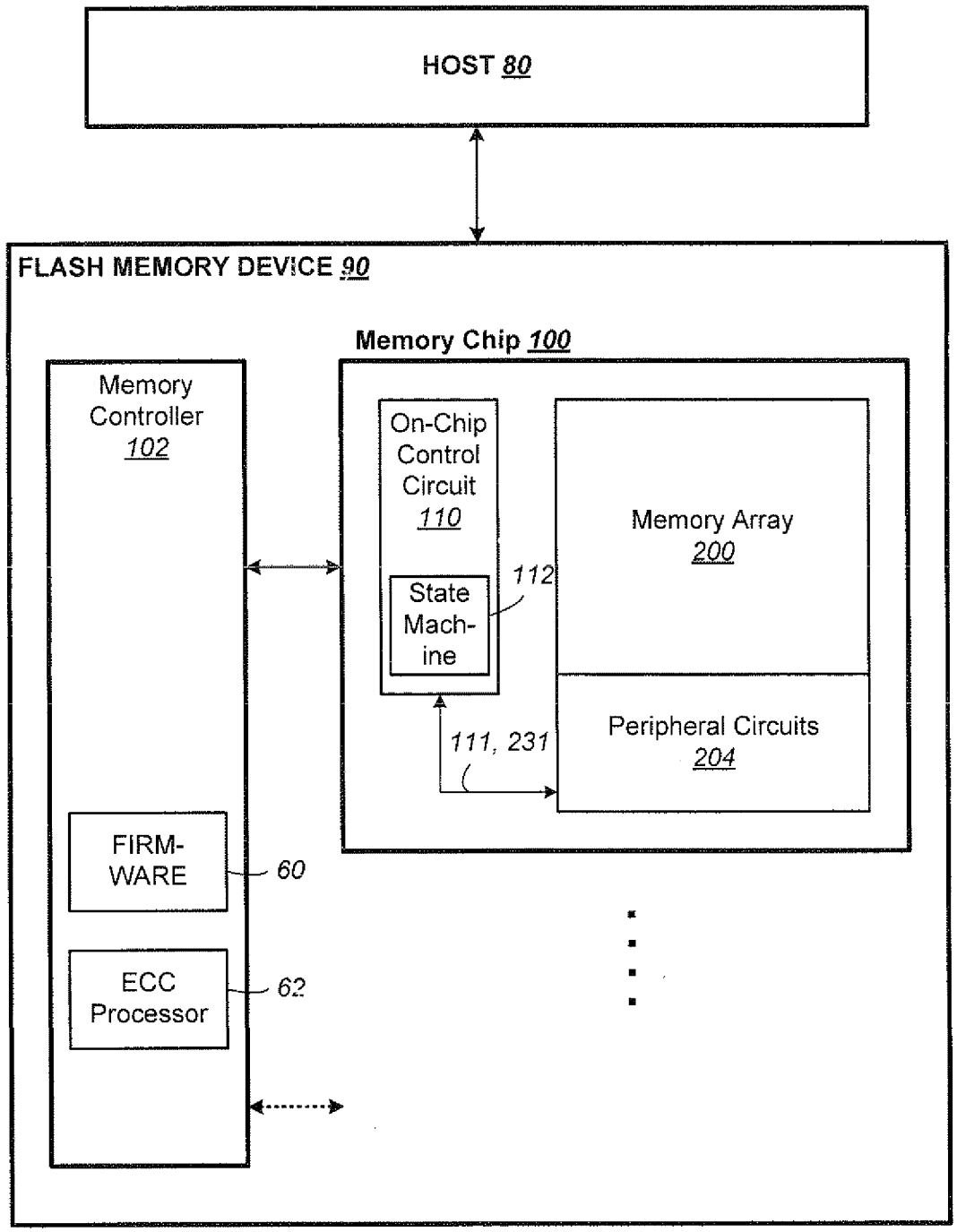
FIG. 1 illustrates a host in communication with a memory device in which the features of the present invention are embodied.

FIG. 1 illustrates a host in communication with a memory device in which the features of the present invention are embodied. The host 80 typically sends data to be stored at the memory device 90 or retrieves data by reading the memory device 90. The memory device 90 includes one or more memory chip 100 managed by a memory controller 102. The memory chip 100 includes a memory array 200 of memory cells with each cell capable of being configured as a multi-level cell ("MLC") for storing multiple bits of data, as well as capable of being configured as a single-level cell ("SLC") for storing 1 bit of data. The memory chip also includes peripheral circuits 204 such as row and column decoders, sense modules, data latches and I/O circuits. An on-chip control circuitry 110 controls low-level memory operations of each chip. The control circuitry 110 is an on-chip controller that cooperates with the peripheral circuits to perform memory operations on the memory array 200. The control circuitry 110 typically includes a state machine 112 to provide chip level control of memory operations via a data bus 231 and control and address bus 111.

In many implementations, the host 80 communicates and interacts with the memory chip 100 via the memory controller 102. The controller 102 co-operates with the memory chip and controls and manages higher level memory operations. A firmware 60 provides codes to implement the functions of the controller 102. An error correction code ("ECC") processor 62 processes ECC during operations of the memory device.

For example, in a host write, the host 10 sends data to be written to the memory array 100 in logical sectors allocated from a file system of the host's operating system. A memory block management system implemented in the controller stages the sectors and maps and stores them to the physical structure of the memory array. A preferred block management system is disclosed in United States Patent Application Publication Number: US-2010-0172180-A1, the entire disclosure of which is incorporated herein by reference.

Physical Memory Architecture

In order to improve read and program performance, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page will be read or programmed together.

Figure 2:
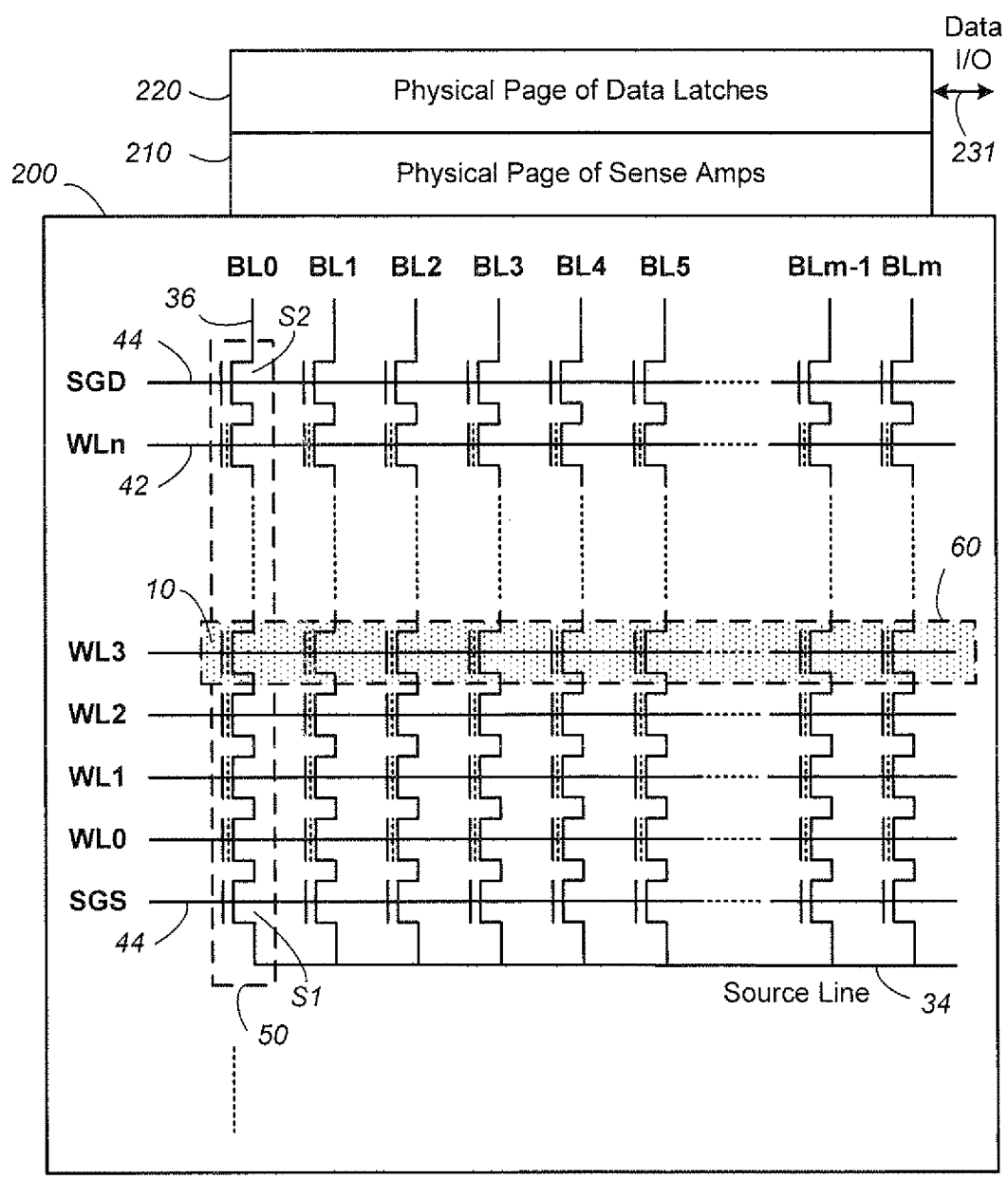
FIG. 2 illustrates a page of memory cells, organized for example in the NAND configuration, being sensed or programmed in parallel.

FIG. 2 illustrates a page of memory cells, organized for example in the NAND configuration, being sensed or programmed in parallel. FIG. 2 essentially shows a bank of NAND strings 50 in the memory array 200 of FIG. 1. A "page" such as the page 60, is a group of memory cells enabled to be sensed or programmed in parallel. This is accomplished in the peripheral circuits by a corresponding page of sense amplifiers 210. The sensed results are latches in a corresponding set of data latches 220. Each sense amplifier can be coupled to a NAND string, such as NAND string 50 via a bit line 36. For example, the page 60 is along a row and is sensed by a sensing voltage applied to the control gates of the cells of the page connected in common to the word line WL3. Along each column, each cell such as cell 10 is accessible by a sense amplifier via a bit line 36. Data in the data latches 220 are toggled in from or out to the memory controller 102 via a data I/O bus 231.

The page referred to above is a physical page memory cells or sense amplifiers. Depending on context, in the case where each cell is storing multi-bit data, each physical page has multiple data pages.

The NAND string 50 is a series of memory transistors 10 daisy-chained by their sources and drains to form a source terminal and a drain terminal respective at its two ends. A pair of select transistors S1, S2 controls the memory transistors chain's connection to the external via the NAND string's source terminal and drain terminal respectively. In a memory array, when the source select transistor S1 is turned on, the source terminal is coupled to a source line 34. Similarly, when the drain select transistor S2 is turned on, the drain terminal of the NAND string is coupled to a bit line 36 of the memory array. Each memory transistor 10 in the chain acts as a memory cell. It has a charge storage element 20 to store a given amount of charge so as to represent an intended memory state. A control gate of each memory transistor allows control over read and write operations. The control gates of corresponding memory transistors of a row of NAND string are all connected to the same word line (such as WL0, WL1, . . . ) Similarly, a control gate of each of the select transistors S1, S2 (accessed via select lines SGS and SGD respectively) provides control access to the NAND string via its source terminal and drain terminal respectively.

Erase Blocks

One important difference between flash memory and other type of memory is that a cell must be programmed from the erased state. That is the floating gate must first be emptied of charge. Programming then adds a desired amount of charge back to the floating gate. It does not support removing a portion of the charge from the floating to go from a more programmed state to a lesser one. This means that update data cannot overwrite existing one and must be written to a previous unwritten location.

Furthermore erasing is to empty all the charges from the floating gate and generally takes appreciably time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together.

Figure 3:
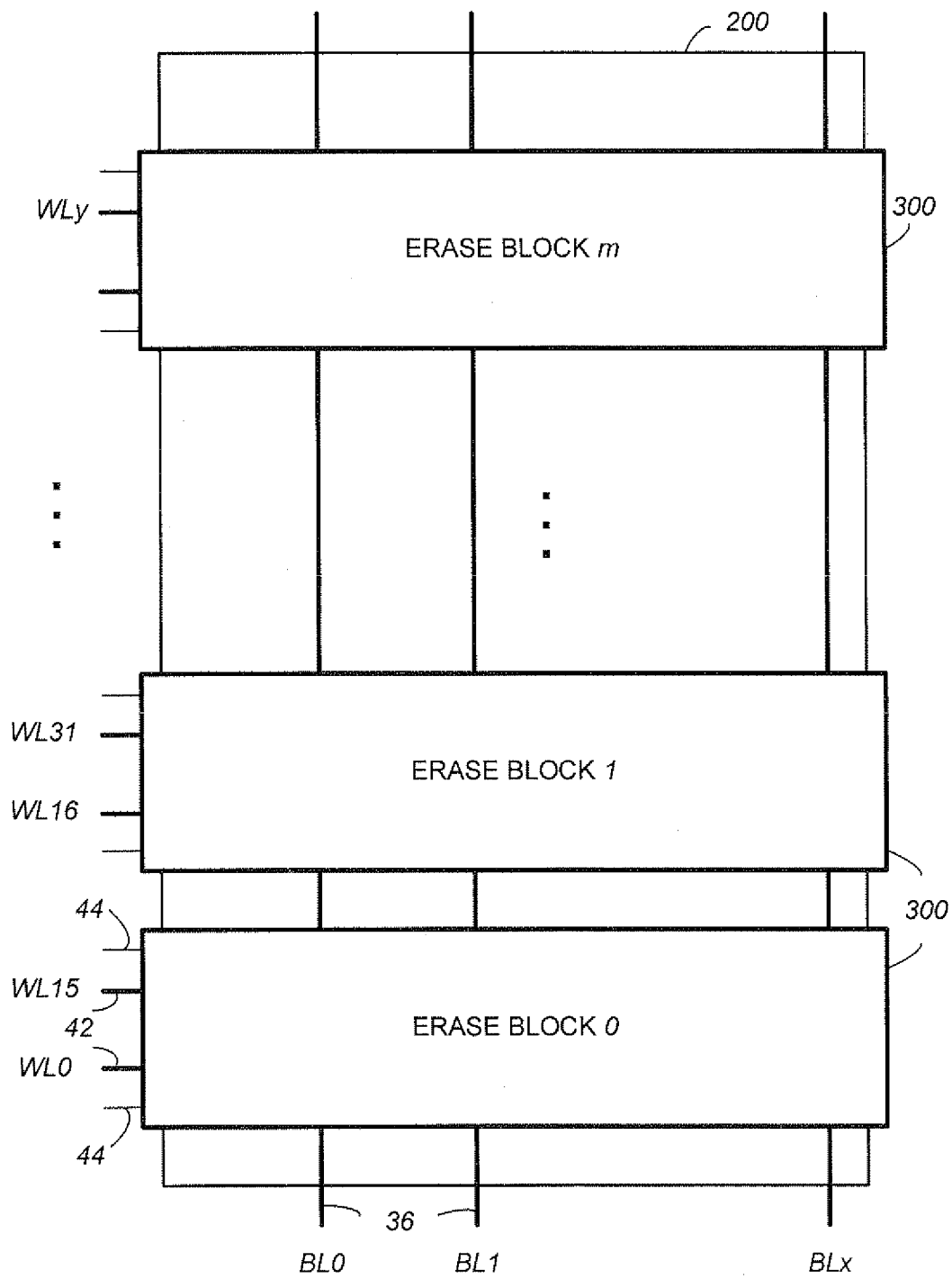
FIG. 3 illustrates schematically an example of a memory array organized in erasable blocks.

FIG. 3 illustrates schematically an example of a memory array organized in erasable blocks. Programming of charge storage memory devices can only result in adding more charge to its charge storage elements. Therefore, prior to a program operation, existing charge in charge storage element of a memory cell must be removed (or erased). A non-volatile memory such as EEPROM is referred to as a "Flash" EEPROM when an entire array of cells 200, or significant groups of cells of the array, is electrically erased together (i.e., in a flash). Once erased, the group of cells can then be reprogrammed. The group of cells erasable together may consist of one or more addressable erase unit 300. The erase unit or block 300 typically stores one or more pages of data, the page being a minimum unit of programming and reading, although more than one page may be programmed or read in a single operation. Each page typically stores one or more sectors of data, the size of the sector being defined by the host system. An example is a sector of 512 bytes of user data, following a standard established with magnetic disk drives, plus some number of bytes of overhead information about the user data and/or the block in with it is stored.

In the example shown in FIG. 3, individual memory cells in the memory array 200 are accessible by word lines 42 such as WL0-WLy and bit lines 36 such as BL0-BLx. The memory is organized into erase blocks, such as erase blocks 0, 1, . . . m. If the NAND string 50 (see FIG. 2) contains 16 memory cells, then the first bank of NAND strings in the array will be accessible by select lines 44 and word lines 42 such as WL0 to WL15. The erase block 0 is organized to have all the memory cells of the first bank of NAND strings erased together. In memory architecture, more than one bank of NAND strings may be erased together.

Examples of Binary (SLC) and Multi-level (MLC) Memory Cells

As described earlier, an example of nonvolatile memory is formed from an array of field-effect transistors, each having a charge storage layer between its channel region and its control gate. The charge storage layer or unit can store a range of charges, giving rise to a range of threshold voltages for each field-effect transistor. The range of possible threshold voltages spans a threshold window. When the threshold window is partitioned into multiple sub-ranges or zones of threshold voltages, each resolvable zone is used to represent a different memory states for a memory cell. The multiple memory states can be coded by one or more binary bits.

Figure 4:
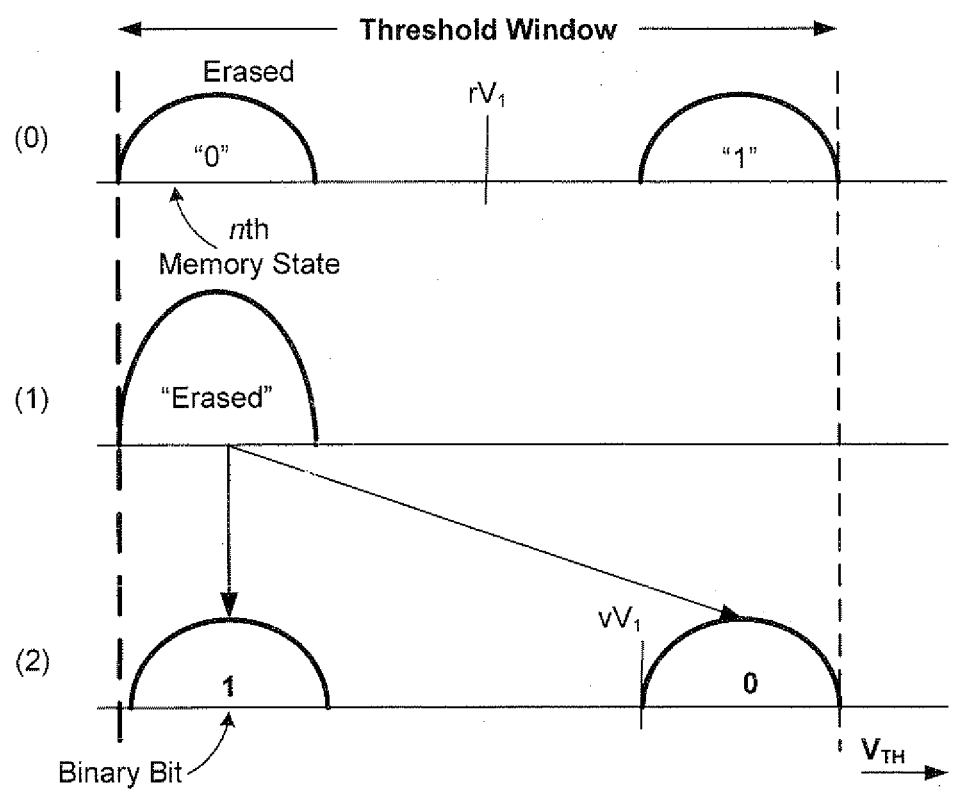
FIG. 4 illustrates a binary memory having a population of cells with each cell being in one of two possible states.

FIG. 4 illustrates a binary memory having a population of cells with each cell being in one of two possible states. Each memory cell has its threshold window partitioned by a single demarcation level into two distinct zones. As shown in FIG. 4(0), during read, a read demarcation level $rV_1$, between a lower zone and an upper zone, is used to determine to which zone the threshold level of the cell lies. The cell is in an "erased" state if its threshold is located in the lower zone and is in a "programmed" state if its threshold is located in the upper zone. FIG. 4(1) illustrates the memory initially has all its cells in the "erased" state. FIG. 4(2) illustrates some of cells being programmed to the "programmed" state. A 1-bit or binary code is used to code the memory states. For example, the bit value "1" represents the "erased" state and "0" represents the "programmed" state. Typically programming is performed by application of one or more programming voltage pulse. After each pulse, the cell is sensed to verify if the threshold has moved beyond a verify demarcation level $vV_1$. A memory with such memory cell partitioning is referred to as "binary" memory or Single-level Cell ("SLC") memory. It will be seen that a binary or SLC memory operates with a wide margin of error as the entire threshold window is only occupied by two zones.

Figure 5:
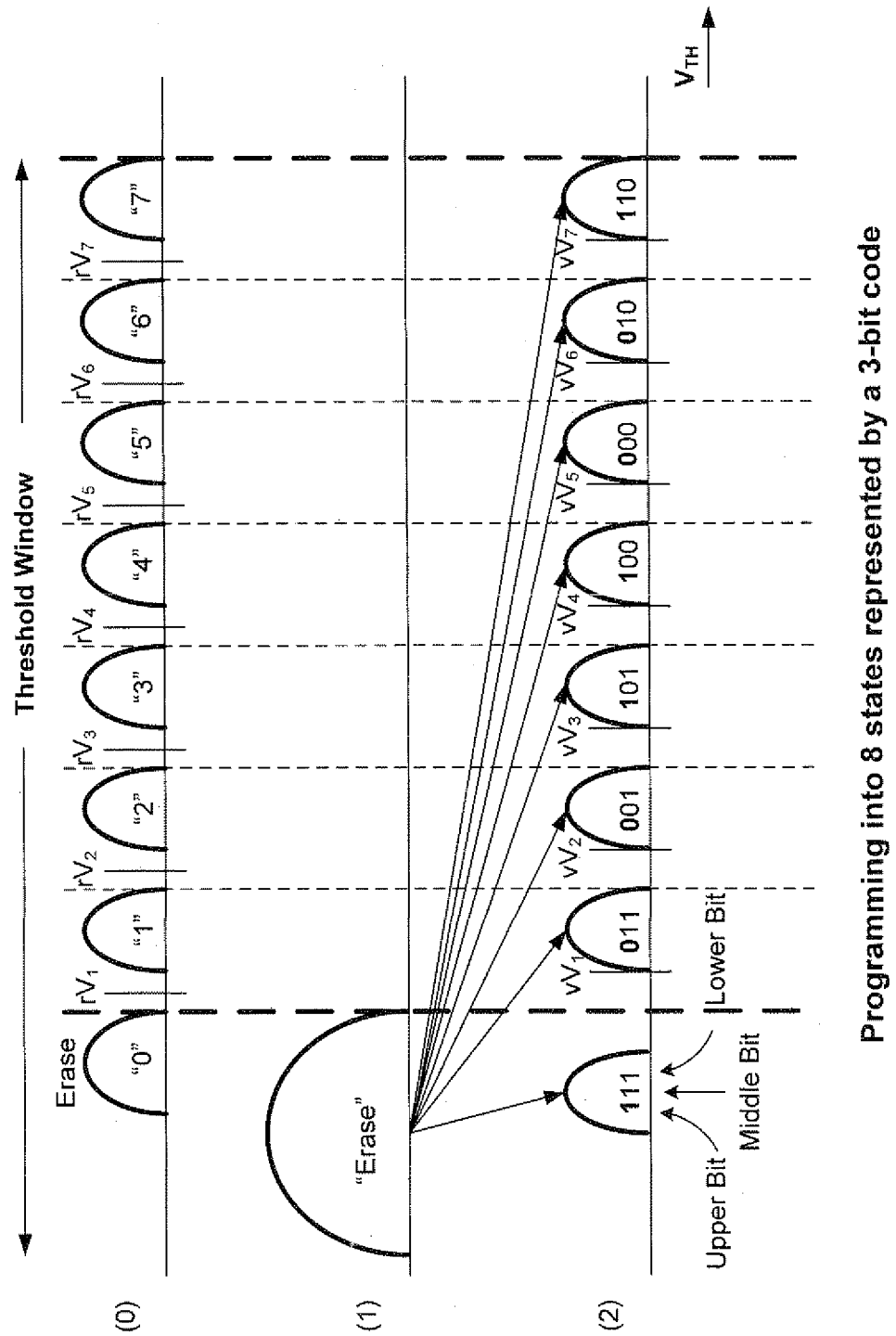
FIG. 5 illustrates a multi-state memory having a population of cells with each cell being in one of eight possible states.

FIG. 5 illustrates a multi-state memory having a population of cells with each cell being in one of eight possible states. Each memory cell has its threshold window partitioned by at least seven demarcation levels into eight distinct zones. As shown in FIG. 5(0), during read, read demarcation levels $rV_1$ to $rV_7$ are used to determine to which zone the threshold level of the cell lies. The cell is in an "erased" state if its threshold is located in the lowest zone and is in one of multiple "programmed" states if its threshold is located in the upper zones. FIG. 5(1) illustrates the memory initially has all its cells in the "erased" state. FIG. 5(2) illustrates some of cells being programmed to the "programmed" state. A 3-bit code having lower, middle and upper bits can be used to represent each of the eight memory states. For example, the "0", "1", "2", "3", "4", "5", "6" and "7" states are respectively represented by "111", "011", "001", "101', "100", "000", "010" and '110". Typically programming is performed by application of one or more programming voltage pulses. After each pulse, the cell is sensed to verify if the threshold has moved beyond a reference which is one of verify demarcation levels $vV_1$. to $vV_7$.

A memory with such memory cell partitioning is referred to as "multi-state" memory or Multi-level Cell ("MLC") memory. In a number programming method employs multiple programming passes before the cells are programmed to their target states in order to alleviate floating-gate to floating-gate perturbations.

Similarly, a memory storing 4-bit code will have lower, first middle, second middle and upper bits, representing each of the sixteen states. The threshold window will be demarcated by at least 15 demarcation levels into sixteen distinct zones.

As the memory's finite threshold window is partitioned into more regions, the resolution for programming and reading will necessarily become finer. Thus, a multi-state or MLC memory necessarily operates with a narrower margin of error compared to that of a memory with less partitioned zones. In other words, the error rate increases with the number of bits stored in each cell. In general, error rate increases with the number of partitioned zones in the threshold window.

Memory Partitioned into SLC and MLC Portions

Figure 6:
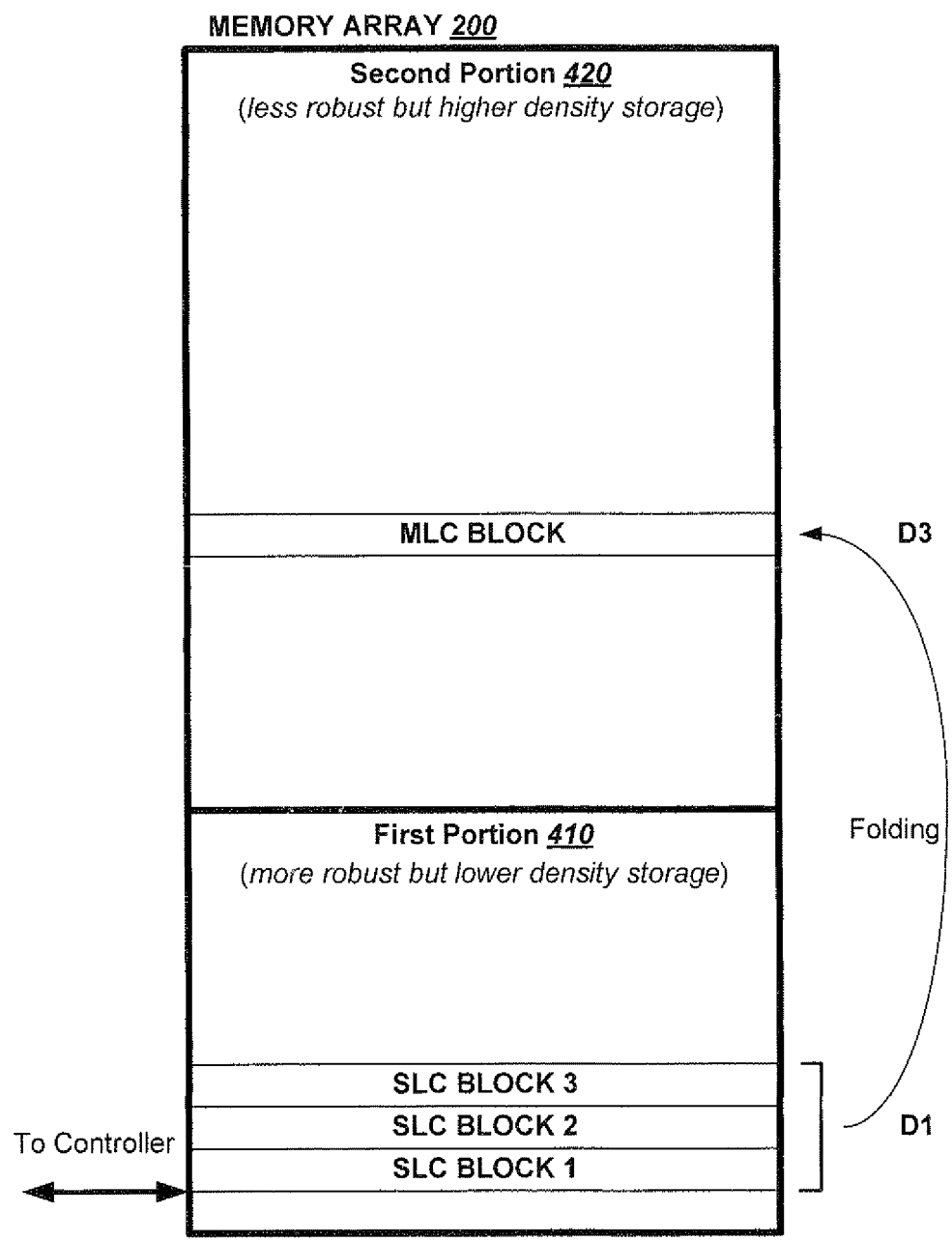
FIG. 6 illustrates an example of a memory suitable for practicing the invention.

FIG. 6 illustrates an example of a memory suitable for practicing the invention. The array of memory cells 200 (see FIG. 1) is partitioned into a first portion 410 and a second portion 420. The second portion 420 has the memory cells configured as high density storage with each cell storing multiple bits of data. The first portion 410 has the memory cells configured as lower density storage with each cell storing less number of bits than that of the second portion. For example, memory cells in the first portion 410 are configured as SLC memory to store 1 bit of data each. Memory cells in the second portion 420 are configured as MLC memory to store 3 bits of data each. The first portion storing 1 bit of data per cell will also be referred as D1 and the second portion storing 3 bit of data per cell as D3. In view of the discussion earlier, the first portion will operate with a much wider margin of error compared to that of the second portion. Thus, memory operations in the first portion will have less error than that in the second portion.

In Step (1), during a host write, input data is first cached in the first portion 410. It is written page by page directly into the second section 420. For example, SLC blocks 1-3 are written in the D1 memory.

In Step (2), the data in the SLC blocks 1-3 are copied (or folded) to a single block of D3 memory in the second portion 420. The folding operation is performed by the memory as controlled by firmware 60 in the controller 102. The operation is preferably conducted in the foreground in a spare period when a host command is operating.

A memory configured with D1 and D3 portion is also disclosed in U.S. application U.S. Ser. No. 12/642,584 filed on Dec. 18, 2009, the entire disclosure of which is incorporated herein by reference.

Error Detection and Correction by Error Correction Code ("ECC")

Flash memory is prone to errors. To ensure error-free data, an error correction code ("ECC") is implemented to correct errors.

Figure 7:
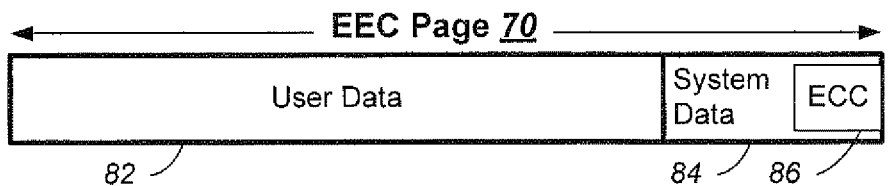
FIG. 7 illustrates schematically a unit of data being stored with an ECC field.

FIG. 7 illustrates schematically a unit of data being stored with an ECC field. As described in connection with FIG. 2, a physical page of memory cells is programmed and read in parallel by virtue of a corresponding page of sense modules operating in parallel. When each memory cell stores multiple bits of data, there will be multiple binary data pages associated with each physical page on a word line. The data page 70 will be referred to as an "ECC page" 70 to indicate that it is a unit of data with its own ECC. The ECC page 70 comprises a user portion 82 and a system portion 84. The user portion 82 is for storage of user data. The system portion 84 is generally used by the memory system for storage of system data. Included in the system data is an ECC 86. The ECC 86 is computed for the data page 70. Typically, the ECC is computed by the ECC processor 62 in the controller 102 (see FIG. 1.) In some embodiments, when the data page is large, it can be partitioned into smaller portions, each with its own ECC.

As data is received from a host, a page of data is staged in the controller 102 and its ECC 86 is computed by the ECC processor 62. The ECC page incorporating the ECC is then written to the memory array 200. Later, when the ECC page is read, it is latched in the data latches 220 and shifted out of the I/O circuits 230 to the controller 102. At the controller 102, the ECC page's existing ECC is compared to a second version of the ECC computed on the read data. The ECC typically includes an error detection code ("EDC") for rapid detection of any error in the data page. If the EDC indicates the existence of any error in the read data page, the ECC is invoked to correct erroneous bits in the read data page. The ECC is designed to correct up to a predetermined maximum number of errors. In practice, at any given time in the life of a memory, the ECC may have budget to correct a predetermined number of errors less than the predetermined maximum.

Figure 8:
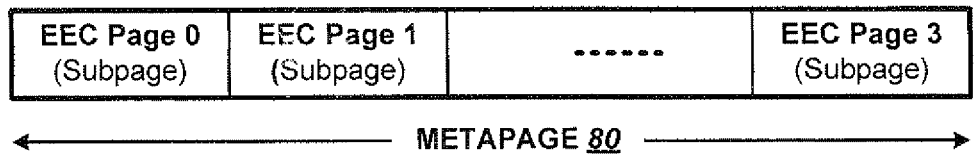
FIG. 8 illustrates one embodiment in which the memory system employs larger parallelism with a metapage containing more than one ECC page.

FIG. 8 illustrates one embodiment in which the memory system employs larger parallelism with a metapage containing more than one ECC page. For example, an ECC page can store 2 Kbytes of data. The metapage 80 can contain four ECC pages, storing 8 Kbytes of data. The memory system can reads and write as much as a metapage at a time.

Figure 9:
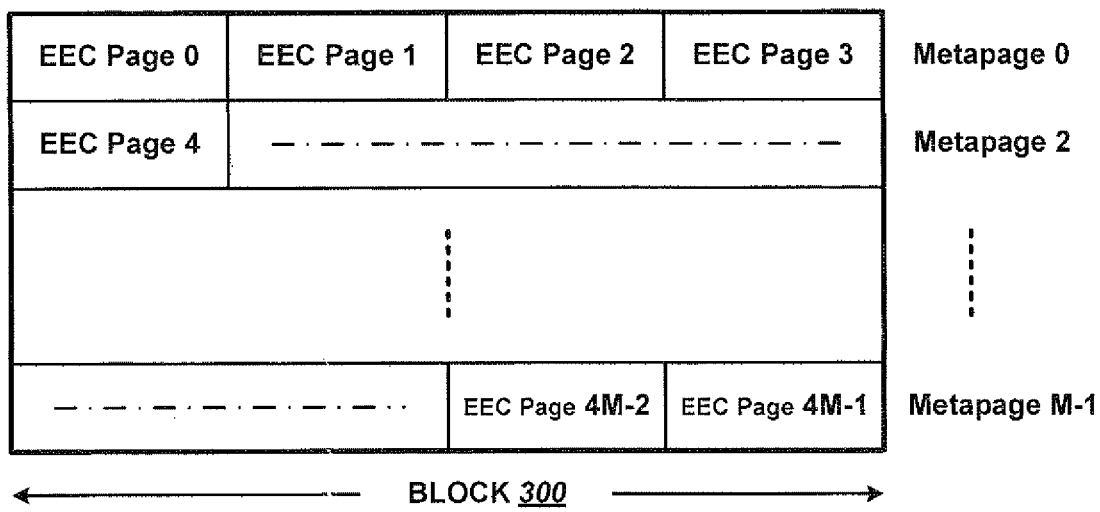
FIG. 9 illustrates an erase block containing multiple ECC pages.

FIG. 9 illustrates an erase block containing multiple ECC pages. As shown in FIG. 3, an erase block 300 is a unit of erase in which all memory cells therein are erased together. FIG. 9 shows the erase block to contain M metapages. For example, the block 300 contains 86 metapages and each metapage contains 4 ECC pages. So the block 300 contains a total of 344 ECC pages.

Error management by ECC is disclosed in U.S. application Ser. No. 12/642,728 filed on Dec. 18, 2009, entitled "NON-VOLATILE MEMORY AND METHOD WITH POST-WRITE READ AND ADAPTIVE RE-WRITE TO MANAGE ERRORS" by Dusija et al, U.S. Patent Publication No. 2011/0099460 A1, the entire disclosure of which is incorporated herein by reference.

Errors in SLC Memory

As described above, data in SLC source blocks tends to have less error compared to that in MLC destination blocks. Nevertheless, data stored in SLC still has errors. One source of error is program disturb on cells in the erase state. This problem is exacerbated when the SLC block has a high hot count, i.e., when it has been wearing out after been subjected to large number of program/erase cycles. The worn SLC block is even more susceptible to program disturb or issues with data retention. If the erroneous SLC data are not being corrected, then when copied to MLC destination blocks, the MLC blocks will end up with even higher error rate and may not be recoverable even with on-system ECC correction scheme.

Figure 10A:
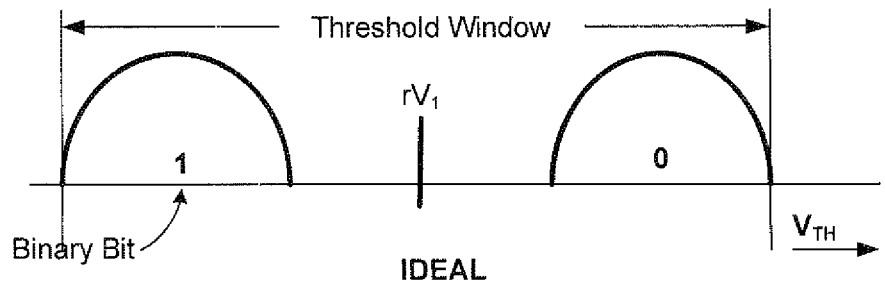
FIG. 10A illustrates an ideal distribution of programmed thresholds for the SLC memory.

FIG. 10A illustrates an ideal distribution of programmed thresholds for the SLC memory. Starting from the erased state (1), some of the memory cells are programmed to the programmed state (0). Having only to distinguish two states in the threshold window of the SLC, a large margin can be maintained between the individual distributions for the two states. The optimal read point $rV_1$ (reference threshold used to read) to distinguish the two states would be midpoint in the margin.

Figure 10B:
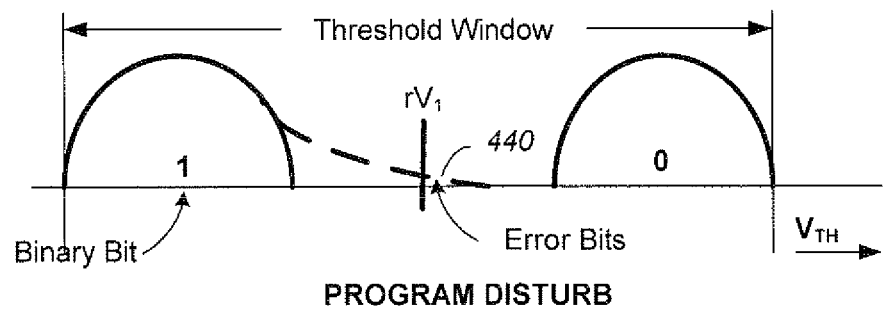
FIG. 10B illustrates the distribution of FIG. 10A in practice where some of the erased cells have been disturbed by neighboring programmed cells.

FIG. 10B illustrates the distribution of FIG. 10A in practice where some of the erased cells have been disturbed by neighboring programmed cells. The thresholds 440 of the disturbed erased cells may creep to higher values than when they were first erased, sometimes to the extent that they may cross over the normal read point and causing them to be erroneously read as a programmed state.

On-Chip Block-Copying with Controlled Error Rate

As described in an earlier section, block-copying or folding of data from SLC to MLC memory portions requires the SLC data to be relatively free of errors. If the errors are to be checked and corrected, the data will first have to be shuttle between the memory chip and the controller where the ECC engine resides. This is time consuming. On the other hand, blind folding of the data from SLC to MLC without error management, could result in the data in MLC ultimately be so erroneous that it is not correctable.

Dynamic Sample Read Error Management before Blind Folding

According to one aspect of the invention, an optimal read point for reading the memory cells in a block of the SLC portion is dynamically determined by trying different read points (trial read threshold voltages, Vt's) dynamically to read a sample of the data of the block so that the data is read within an error budget. Once the optimal read point is determined, it is used to read the entire block without further error checking.

According to a preferred embodiment, the SLC block of data comprises of a plurality of data pages, each having an ECC associated therewith. The measure of the error rate of the SLC block of data is by checking the ECC of a sample of the data pages of the block, wherein the error bits of any of the data pages in the sample must be within the error budget. At least the sample data pages need be subject to the dynamic read and be shuttled to the controller for ECC checking. If a trial read point results in all the sample data pages to have error rates within the error budget, the trial read point is selected to read the entire SLC block without further need for ECC checking (blind reading). Then the data read from the SLC portion are copied (blind folded) to the MLC portion.

Figure 11:
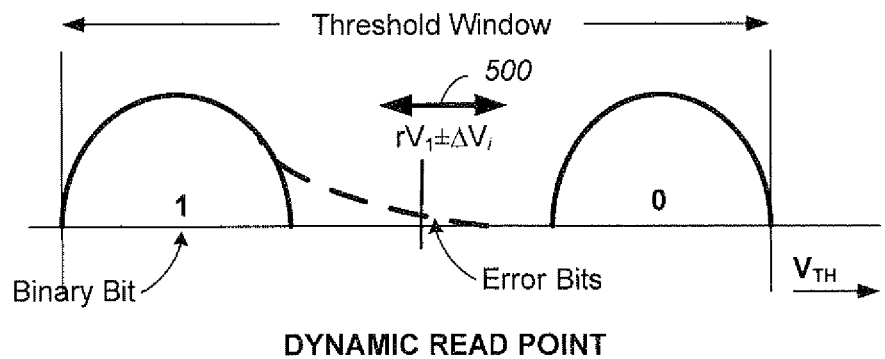
FIG. 11 illustrates the various trial read points in a dynamic read scheme to determine an optimal read point to minimize errors resulting from program disturb.

FIG. 11 illustrates the various trial read points in a dynamic read scheme to determine an optimal read point to minimize errors resulting from program disturb. For example, the read point may be shifted by $\Delta V=0.25V$ or through a number of trail points to determine an optimal read point that yields an error rate not to exceed a error threshold.

Preferably, the pages most likely to have the highest error rates are selected as sample pages. In a preferred embodiment, only the first and last page of the SLC block is selected in the sample. For D1 to D3 folding, three SLC blocks will be folding into one MLC block and therefore a total of six pages from the three SLC blocks will be toggled out to the controller for ECC operations.

In another embodiment, after the SLC sampled page is read from the NAND and passed through the ECC engine in the controller, the memory system can either retain the data in the controller RAM or discard the data without writing it to the controller RAM.

In the event that an optimal NAND internal read level cannot be found for a first SLC source block, the data from the first SLC source block will be copied to a second, new SLC source block, preferably with a smaller hot count. Then the dynamic sample read error management can be started on the second SLC block instead.

To ensure the second SLC source block can be selected with a small hot count, at least some SLC blocks, which are not actively used to keep their hot count low, are kept in a separate pool.

Figures 12, 13:
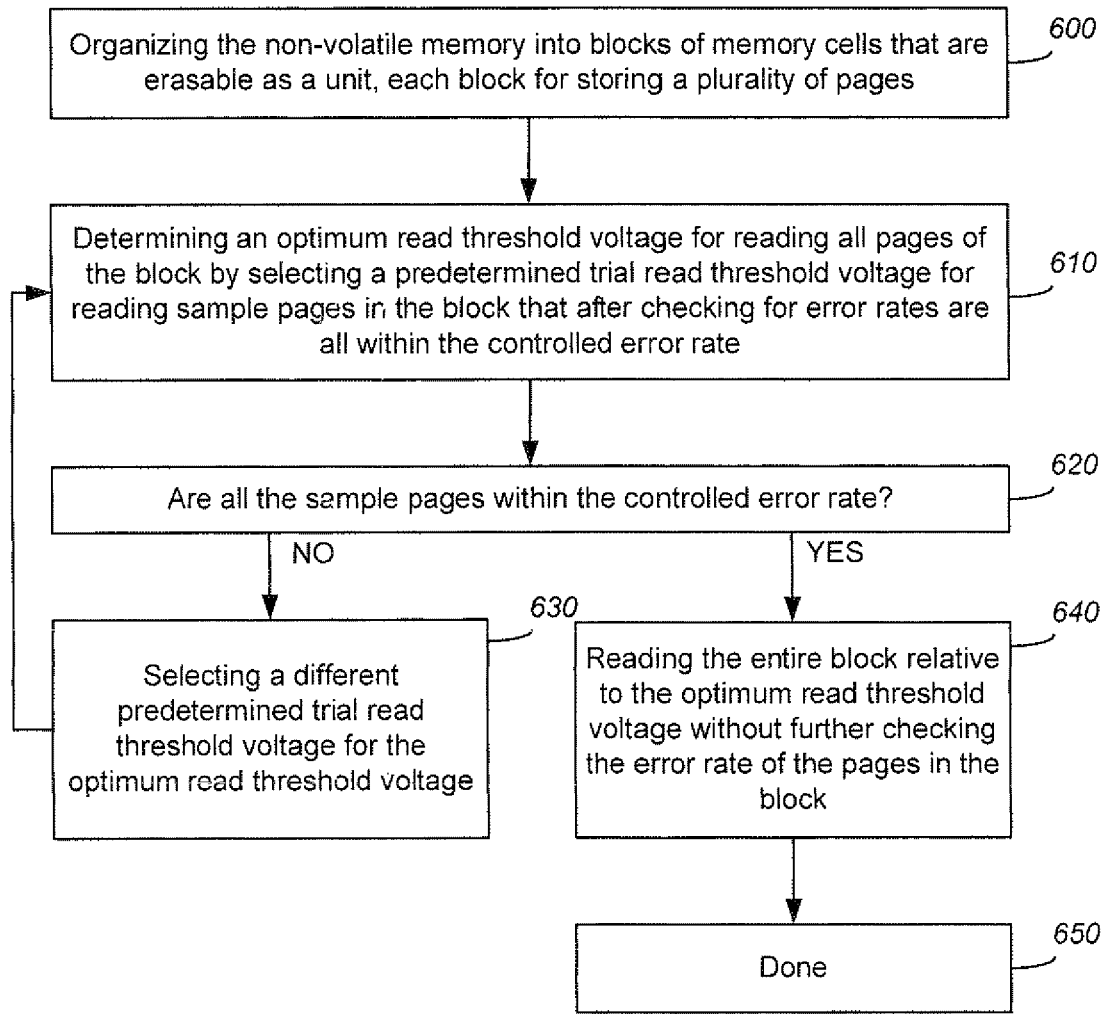
FIG. 12 is a flow diagram illustrating reading a block of data with controlled error rate.
FIG. 13 illustrates a table for storing various attributes for each block. The table 700 stores for each block one or more of such attributes listed.

FIG. 12 is a flow diagram illustrating reading a block of data with controlled error rate.

STEP 600: Organizing the non-volatile memory into blocks of memory cells that are erasable as a unit, each block for storing a plurality of pages.

STEP 610: Determining an optimum read threshold voltage for reading all pages of the block by selecting a predetermined trial read threshold voltage for reading sample pages in the block that after checking for error rates are all within the controlled error rate.

STEP 620: Are all the sample pages within the controlled error rate? If NO, go to STEP 630; if YES, go to STEP 640.

STEP 630: Selecting a different predetermined trial read threshold voltage for the optimum read threshold voltage. Return to STEP 610.

STEP 640: Reading the entire block relative to the optimum read threshold voltage without further checking the error rate of the pages in the block.

STEP 650: Done

This method addresses the problem of erase disturb where some blocks due to its data pattern and/or its age have significant erase-state creep. The dynamic read ensures the read errors are within an error budget. At the same time, sampling greatly reduces the number of trial and errors and shuttling to the controller for ECC processing.

According to another aspect of the invention, without transferring data from NAND memory to the controller for ECC checking of the samples, an alternative method is to count the number of bits in the forbidden zone (between the erase and adjacent program state) and then move the NAND memory's read Vt threshold to the point in which the least amount of bits are counted.

Preferably counters are used to count the number of 0's and the number of 1's for the sample page being read. By reading repeatedly at different trial Vt threshold, we should see the values of these 2 counters shifting. Once we see the cross over point (either we start seeing no change which means that there is a clear separation of erase and program state, or that we see the values trending opposite which means that we have crossed the "valley"), we know where this value is and the Vt to use as an optimum read point for subsequent reads.

For example for the latter case, if we see 1's>0's at default Vt, we will continue to move the Vt up. At some point, we should see the opposite when 1's<0's. This is the valley (lowest point where we will have the optimum Vt to use).

Intelligent Error Management before Blind Folding

Since SLC source blocks typically have very few error bits when their program/erase cycles (hot count) are few, the dynamic sample read error management described above need not be enabled when the block in question has a low hot count. This will improve performance even though the dynamic sample read error management is quite efficient. Only when the SLC block's hot count has reached a predetermined threshold will the dynamic sample read error management be enabled.

According to another aspect of the invention, the dynamic sample read error management on a given block is enabled only when the block's hot count has reached a predetermined threshold.

According to yet another aspect of the invention, a tag is associated with each block to indicate if the dynamic sample read error management should or should not be enabled for the block in question.

In one embodiment, the tag is set for enabling if the hot count of the block has reached a predetermined threshold.

In another embodiment, the tag is set for enabling if the data has been stored in the block past a predetermined period.

In another embodiment, additional tagging mechanisms (e.g., table maintained in flash memory) are provided to match different dynamic read cases (e.g., the amount of $\Delta V$) per tag and to use them when needed without the need to look on each read. Such tagging mechanisms can be time based rather than based on hot count. Furthermore, how often the tagging table shall be updated can be fine-tuned, based on targeted product's performance requirements.

FIG. 13 illustrates a table for storing various attributes for each block. The table 700 stores for each block one or more of such attributes listed. For example, the attributes include a tag that indicates whether the dynamic sample read error management is enabled or not. The tag value may be set manually or as a function of the other attributes such as hot count and period of data stored in a block. Also another example has the attributes including the trial read points that are different for different blocks.

Advantage of this solution is that system performance impact is minimized and there is no increase in controller RAM space.

Although the various aspects of the present invention have been described with respect to certain embodiments, it is understood that the invention is entitled to protection within the full scope of the appended claims.

It is claimed:

1. A method of reading a block of data with controlled error rate from a non-volatile memory, comprising:
   (a) organizing the non-volatile memory into blocks of memory cells that are erasable as a unit, each block for storing a plurality of pages;
   (b) determining an optimum read threshold voltage for reading all pages of the block by selecting a predetermined trial read threshold voltage for reading sample pages in the block that after checking for error rates are all within the controlled error rate;
   (c) if not all the sample pages are within the controlled error rate, repeating (b) by selecting a different predetermined trial read threshold voltage for the optimum read threshold voltage until all the sample pages are within the controlled error rate; and
   (d) if all the sample of pages are within the controlled error rate, reading the entire block relative to the optimum read threshold voltage without further checking the error rate of the pages in the block.

2. The method as in claim 1, further comprising:
providing an ECC for each of the pages of the block; and
the ECC for each sample page is checked to determine an error rate for the sample page.

3. The method as in claim 1, wherein:
said selecting a predetermined trial read threshold voltage is by selecting one that produces a minimum number of bits with threshold voltages between an erase state and an adjacent programmed state.

4. The method as in claim 1, further comprising:
keeping track of the number program-erase cycling of each block by a hot count; and
initiating said method for a block only after the hot count for the block has reached a predetermined threshold.

5. The method as in claim 1, further comprising:
keeping track of the period the block of data has been stored; and
initiating said method for the block only after the period has passed a predetermined period.

6. The method as in claim 1, further comprising:
maintaining a table for tagging which blocks should have said method enabled or disabled based on predetermined criteria.

7. The method as in claim 6, wherein said table include block-dependent choices of the different predetermined read threshold voltages.

8. The method as in claim 1, wherein the blocks have memory cells that are each configured to store one bit of data.

9. The method as in claim 1, wherein the block of data read is copied to another portion of the non-volatile memory.

10. The method as in claim 9, wherein the another portion of the non-volatile memory has memory cells that are each configured to store more than one bit of data.

11. A non-volatile memory, comprising:
blocks of memory cells that are erasable as a unit, each block for storing a plurality of pages;
a state machine for performing operations of the non-volatile memory; said operations including reading a block of data with controlled error rate, comprising:
   (a) determining an optimum read threshold voltage for reading all pages of the block by selecting a predetermined trial read threshold voltage for reading sample pages in the block that after checking for error rates are all within the controlled error rate;
   (b) if not all the sample pages are within the controlled error rate, repeating (a) by selecting a different predetermined read threshold voltage for the optimum read threshold voltage until all the sample pages are within the controlled error rate; and
   (c) if all the sample of pages are within the controlled error rate, reading the entire block relative to the optimum read threshold voltage without further checking the error rate of the pages in the block.

12. The non-volatile memory as in claim 11, further comprising:
an ECC for each of the pages of the block; and
the ECC for each sample page is checked to determine an error rate for the sample page.

13. The non-volatile memory as in claim 11, wherein:
said selecting a predetermined trial read threshold voltage is by selecting one that produces a minimum number of bits with threshold voltages between an erase state and an adjacent programmed state.

14. The non-volatile memory as in claim 11, further comprising:
a table including a hot count for keeping track of the number program-erase cycling of each block; and
wherein said operation of reading a block of data with controlled error rate is initialized only after the hot count for the block has reached a predetermined threshold.

15. The non-volatile memory as in claim 11, further comprising:
a table including keeping track of the period data in each block has been stored; and
wherein said operation of reading a block of data with controlled error rate is initialized only after the period has passed a predetermined period.

16. The non-volatile memory as in claim 11, further comprising:
a table including tagging which blocks are enabled or disabled based on predetermined criteria for said operation of reading a block of data with controlled error rate.

17. The non-volatile memory as in claim 16, wherein said table include block-dependent choices of the different predetermined read threshold voltages.

18. The non-volatile memory as in claim 11, wherein the blocks have memory cells that are each configured to store one bit of data.

19. The non-volatile memory as in claim 11, wherein the block of data read is copied to another portion of the non-volatile memory.

20. The non-volatile memory as in claim 19, wherein the another portion of the non-volatile memory has memory cells that are each configured to store more than one bit of data.

* * * * *